(12) United States Patent
Yang et al.

(10) Patent No.: US 6,486,009 B2
(45) Date of Patent: Nov. 26, 2002

(54) METHOD OF FABRICATING THIN-FILM TRANSISTOR

(75) Inventors: Chien-Sheng Yang, Taipei (TW); Fang-Chen Luo, Hsinchu (TW)

(73) Assignee: Unipac Optoelecyronics Corp., Hsinchu (TW)

( * ) Notice: Subject to any disclaimer, the term of this patent is extended or adjusted under 35 U.S.C. 154(b) by 0 days.

(21) Appl. No.: 09/843,994

(22) Filed: Apr. 27, 2001

(65) Prior Publication Data

US 2001/0035528 A1 Nov. 1, 2001

(30) Foreign Application Priority Data

Apr. 28, 2000 (TW) .......................................... 89108111

(51) Int. Cl.[7] .......................... H01L 21/00; H01L 21/84
(52) U.S. Cl. ....................... 438/151; 438/152; 438/166; 438/167
(58) Field of Search .................................. 438/151, 152, 438/161, 166, 167, 149, 197; 257/49, 59, 347, 249, 352, 412, 308

(56) References Cited

U.S. PATENT DOCUMENTS

| | | | | |
|---|---|---|---|---|
| 6,207,480 B1 | * | 3/2001 | Cha et al. ....................... | 349/42 |
| 6,236,062 B1 | * | 5/2001 | Nakahori et al. ........... | 257/249 |
| 6,300,152 B1 | * | 10/2001 | Kim ............................. | 349/138 |
| 6,331,443 B1 | * | 12/2001 | Lee et al. .................... | 438/151 |
| 6,372,083 B1 | * | 4/2002 | Oana et al. .................. | 118/695 |
| 6,387,738 B2 | * | 5/2002 | Kim ............................ | 438/151 |
| 6,391,691 B1 | * | 5/2002 | Tsujimura et al. .......... | 438/151 |
| 6,399,428 B2 | * | 6/2002 | Nakahori et al. ........... | 438/149 |

* cited by examiner

Primary Examiner—Michael S. Lebentritt
(74) Attorney, Agent, or Firm—J.C. Patents

(57) ABSTRACT

A method of fabricating a thin-film transistor on an insulation substrate. A first conductive layer, a gate dielectric layer, a silicon layer and a doped silicon layer are formed on the insulation substrate. These four layers are patterned to form a gate and a gate line. A second conductive layer is formed over the insulation substrate. The second conductive layer and the doped silicon layer are patterned to form a source/drain region, a source/drain conductive layer and a source/drain line on both sides of the gate line. A protection layer is formed over the insulation layer, followed by a patterning step to form openings on the source/drain conductive layer and the source/drain line. A transparent conductive layer is formed on the protection layer and in the openings.

After being patterned, a pixel electrode is formed, and a portion of the transparent conductive layer remains to electrically connect the source/drain line and the source/drain conductive layer. The method of fabricating the thin-film transistor can be applied to fabrication of fax machine, CIS such as scanner and various electronic devices. It can also be applied to fabrication of normal thin-film transistor flat panel display such as liquid crystal display (LCD) and organic light emitting diode (OLED).

18 Claims, 6 Drawing Sheets

METHOD OF FABRICATING THIN-FILM TRANSISTOR

CROSS-REFERENCE TO RELATED APPLICATION

This application claims the priority benefit of Taiwan application serial no. 89108111, filed Apr. 28, 2000.

BACKGROUND OF THE INVENTION

1. Field of the Invention

The invention relates in general to a method of fabricating a thin-film transistor (TFT). More particularly, this invention relates to a method of fabricating a thin-film transistor using four photomasks. In addition to the applications of fax machine, contact image sensor (CIS) such as a scanner and various electronic devices, this method can also applied to fabrication of thin-film transistor flat panel display such as liquid crystal display (LCD) and organic light-emitting diode (OLED).

2. Description of the Related Art

A thin-film transistor flat panel display basically comprises a thin-film transistor device and a flat panel display device. The thin-film transistor device further comprises more than one thin-film transistor arranged as an array. Each thin-film transistor corresponds to one pixel electrode. The thin-film transistors are formed with the stack of a gate, a gate dielectric layer, a channel layer and a source/drain region stacked on an insulation substrate. The thin-film transistors in the thin-film transistor flat panel display are normally used as switching devices.

In FIG. 1A, an insulation substrate 100 is provided. A conductive layer is sputtered on the insulation substrate 100. The conductive layer of a single or multiple layers (such as a composite layer) is made of at least one type or multiple types of metal or alloy thereof. The metal or the alloy of these metals is selected from aluminum, copper, gold, silver, molybdenum, chromium, titanium, tungsten, wherein the aluminum alloy further includes neodymium Nd). As an example, the conductive layer includes at least a titanium/aluminum/titanium composite layer (not shown), and the alloy thereof, wherein the aluminum alloy may further include neodymium. Using a first photolithography and etching process, the chromium/aluminum composite layer is patterned as a gate 110 and a gate line.

In FIG. 1B, a silicon nitride layer ($SiN_x$) 120, a hydrogenated amorphous silicon layer (a-Si:H) 130 and a doped amorphous silicon layer ($n^+$ a-Si) 140 are formed in sequence on the insulation substrate 100. A second photolithography and etching step is performed to pattern the doped amorphous silicon layer 140 and the hydrogenated amorphous silicon layer 130. As shown in FIG. 1B, the patterned doped amorphous silicon layer 140 and the doped hydrogenated amorphous silicon layer 130 are aligned over the gate 110.

In FIG. 1C, a conductive layer is sputtered on the insulation substrate 100. The conductive layer of a single or multiple layers (such as a composite layer) is made of at least one type or multiple types of metal or alloy thereof. The metal or the alloy of these metals is selected from aluminum, copper, gold silver, molybdenum, chromium, titanium, tungsten, wherein the aluminum alloy further includes neodymium (Nd). As an example, the conductive layer includes at least a titanium/aluminum/titanium composite layer (not shown), and the alloy thereof, wherein the aluminum alloy can further include neodymium. A third photolithography and etching step is performed to form a doped amorphous silicon layer 140, a source/drain line 150a, a source/drain metal layer 150 and a source/drain region 140a.

In FIG. 1D, a silicon nitride protection layer 160 is formed over the insulation substrate 100. A fourth photolithography and etching step is performed to form an opening 166 in the silicon nitride protection layer 160. The opening 166 exposes a portion of the source/drain metal layer 150.

In FIG. 1E, an indium tin oxide layer (ITO) 170 is sputtered over the substrate 100. A fifth photolithography and etching step is performed to form a pixel electrode 170.

As mentioned above, the conventional method requires five photolithography and etching steps to form the thin-film transistor. For each photolithography and etching step, processes such as dehydration bake, priming, photoresist coating, soft bake, exposure, post-back of exposure, development, hard back and etching are performed. Thus, each additional photolithography and etching step greatly increases the fabrication cost. Furthermore, the yield of products decreases as they undergo each additional photolithography and etching step.

SUMMARY OF THE INVENTION

The invention provides a method of fabricating a thin-film transistor, preferably on an insulation substrate. The method can be applied to fabrication of fax machine, CIS such as scanner and various electronic devices. In addition, the method can also be applied to fabrication of thin-film transistor flat panel display such as liquid crystal display and organic light-emitting diode (OLED).

A first conductive layer, a gate dielectric layer, a silicon layer and a doped silicon layer are formed on an insulation substrate in sequence and patterned to form a gate and a gate line. A second conductive layer is formed over the insulation substrate. The second conductive layer and the doped silicon layer are patterned to form a source/drain line, a source/drain conductive layer and a source/drain region. The source/drain line is located at both sides of the gate line without being connected to the source/drain conductive layer, so as to avoid a short circuit caused by any contact between the source/drain line and the gate and the gate line. A protection layer is formed and patterned over the insulation substrate so that openings are formed on the source/drain conductive layer and the source/drain line at both sides of the gate line. A transparent conductive layer is formed over the insulation substrate. The transparent conductive layer is patterned to form a pixel electrode, and a portion of the remaining transparent conductive layer electrically connects the source/drain line at both sides of the gate line with the source/drain conductive layer.

Thus constructed, only one photolithography and etching step is required for patterning the doped silicon layer to form the gate and gate line. Another photolithography and etching step is required for forming the source/drain line, the source/drain conductive layer and the source/drain region. Therefore, the steps of photolithography and etching are reduced from five to four. Consequently, the fabrication cost is decreased and the yield of the product is enhanced.

Both the foregoing general description and the following detailed description are exemplary and explanatory only and are not restrictive of the invention, as claimed.

DESCRIPTION OF THE PREFERRED EMBODIMENTS

Figure 1A:
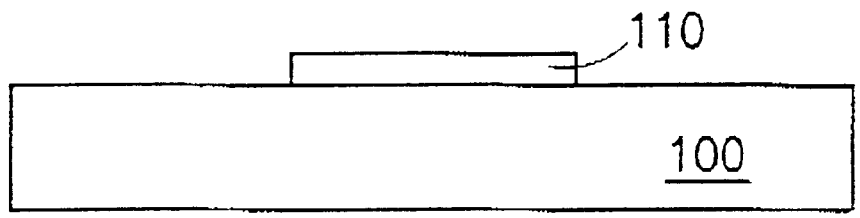
FIGS. 1A to 1E shows a conventional method for fabricating a thin-film transistor of a thin-film transistor liquid crystal display.
Figure 1B:
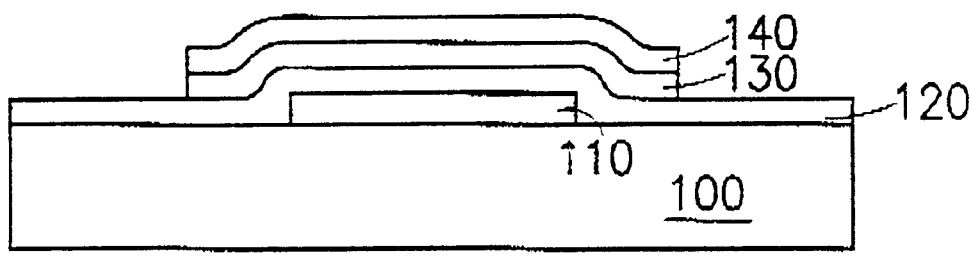
Figure 1C:
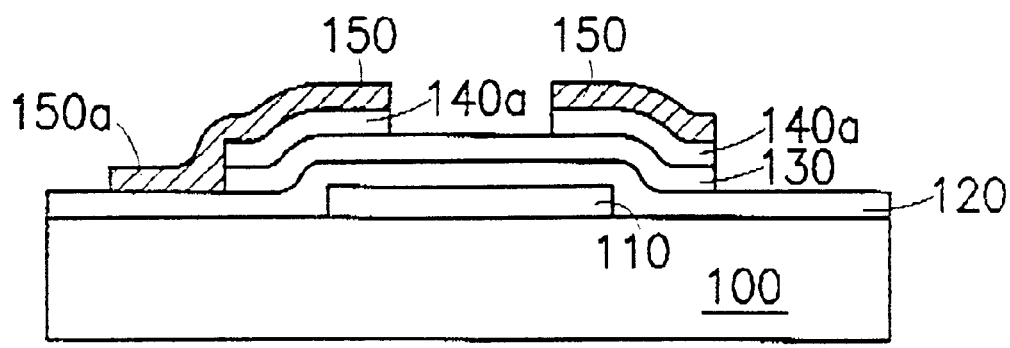
Figure 1D:
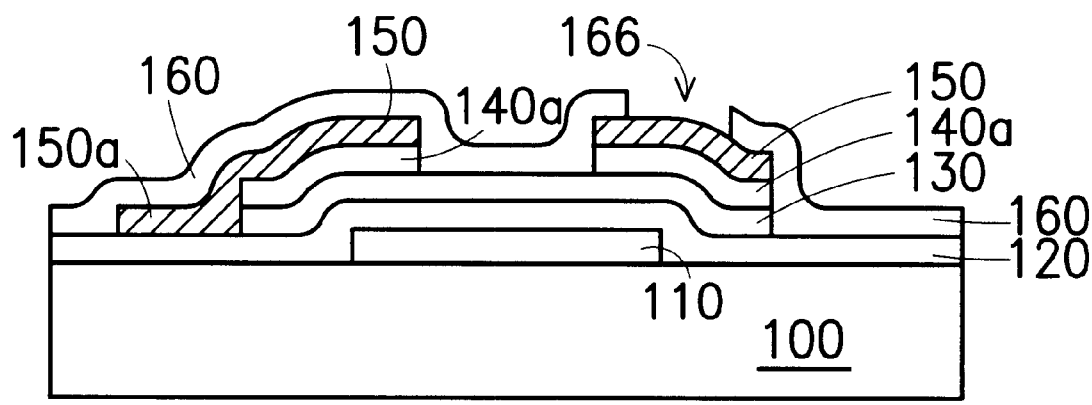
Figure 1E:
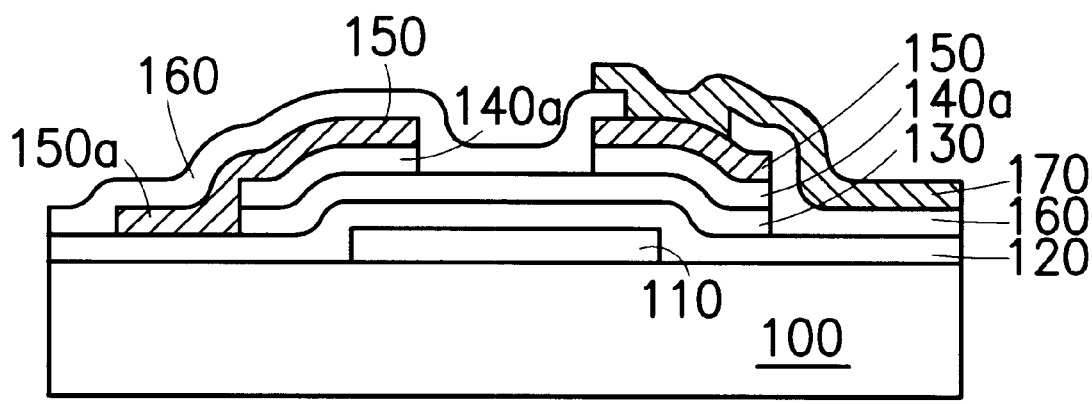
Figure 2:
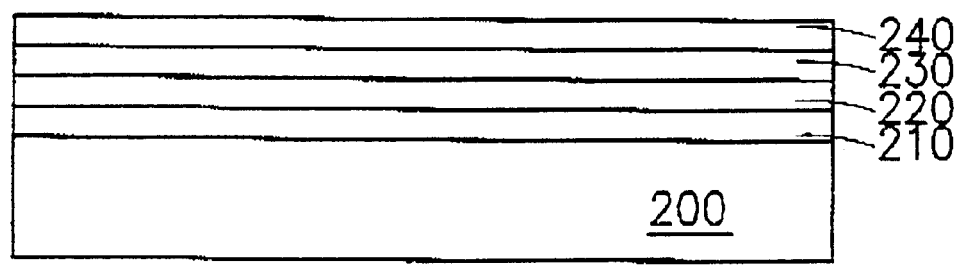
FIG. 2, FIG. 3A, FIG. 4 and FIGS. 5A, 6A and 7A are cross sectional views showing a fabrication process of a thin-film transistor according to the invention.

In FIG. 2, an insulation substrate 200 is provided. A conductive layer 210, a gate dielectric layer 220, a silicon layer 230 and a doped silicon layer 240 are formed on the insulation substrate 200. The conductive layer 210 is a single layer or a composite layer made of materials selected from one or more kinds of metals or alloys including aluminum (Al), copper (Cu), gold (Au), silver (Ag), molybdenum (Mo), chromium (Cr), titanium (Ti) and tungsten (W). When aluminium alloy is used, material such as neodymium (Nd) may also be included. In one preferred embodiment, the conductive layer 210 comprises at least a Ti/Al/Ti composite layer. The Ti/Al/Ti also includes the alloy thereof, and the Al alloy may include neodymium (Nd). The gate dielectric layer 220 is preferably a silicon nitride layer. The material of the silicon layer 230 includes, for example, amorphous silicon. The doped silicon layer 240 comprises, for example, an N-type amorphous silicon.

Figure 3A:
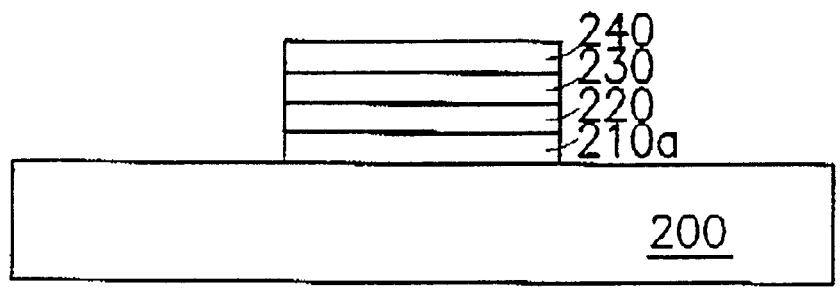
Figure 3B:
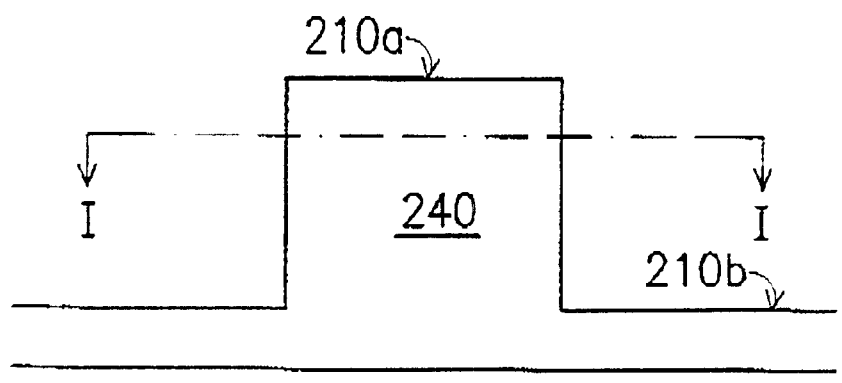
FIG. 3B and FIGS. 5B, 6B and 7B are top views of the fabrication process of the thin-film transistor as shown in FIG. 3A and FIGS. 5A, 6A and 7A.

In FIG. 3A, the conductive layer 210, the gate dielectric layer 220, the silicon layer 230 and the doped silicon layer 240 are patterned using a first photolithography and etching step to form a gate 210a and a gate line 210b (as shown in FIG. 3B). FIG. 3A is a cross sectional view cutting along line I—I in FIG. 3B.

Figure 4:
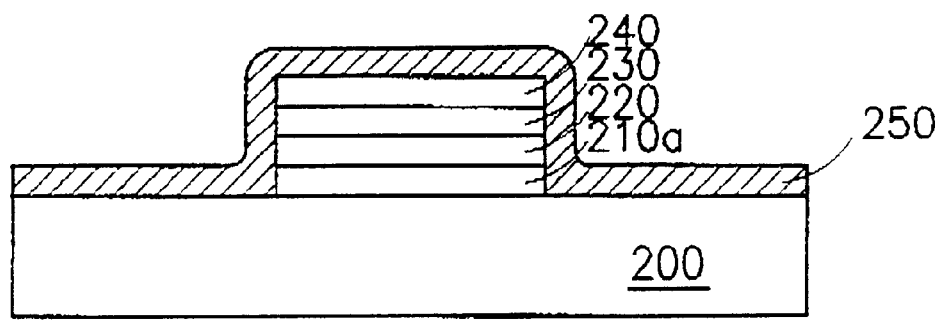

In FIG. 4, a conductive layer 250 is formed over the insulation substrate 200. Preferably, as shown in FIG. 4, the conductive layer 250 conforms to the surface topography of the insulation substrate 200. The conductive layer 250 is a single layer or a composite layer made of materials selected from one or more kinds of metals or alloys including aluminum (Al), copper (Cu), gold (Au), silver (Ag), molybdenum (Mo), chromium (Cr), titanium (Ti) and tungsten (W). When an aluminium alloy is used, material such as neodymium (Nd) may also be included. In one preferred embodiment, the conductive layer 210 comprises at least a Ti/Al/Ti composite layer. The Ti/Al/Ti also includes the alloy thereof, and the Al alloy may include neodymium (Nd)

Figure 5A:
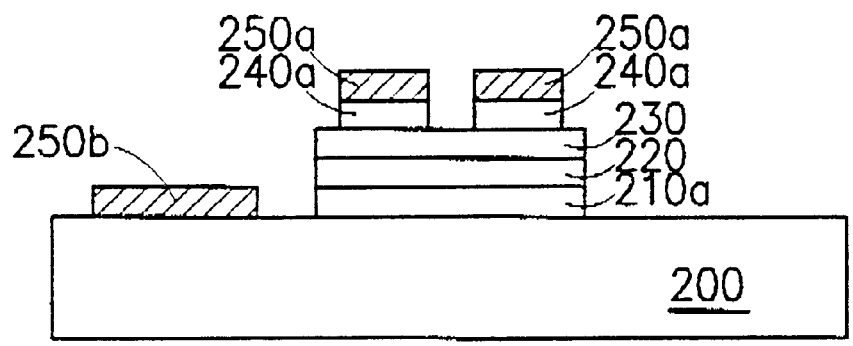
Figure 5B:
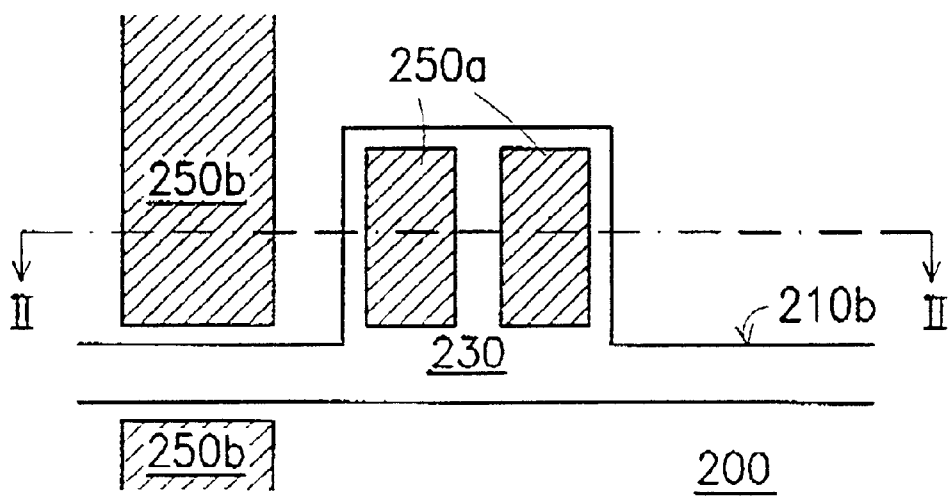

FIG. 5A is a cross sectional view cutting along the line II—II in FIG. 5B. Referring to FIG. 5A and FIG. 5B, a second photolithography and etching step is performed on the conductive layer 250 and the doped silicon layer 240 to form source/drain conductive layers 250a, a source/drain line structure 250b on the insulation substrate 200 and source/drain regions 240a. The source/drain conductive layers 250a and the underlying source/drain regions 240a are located on the gate 210a. In this embodiment, the source/drain line structure 250b formed on the insulation substrate 200 preferably comprises a patterned conductive layer 250b and doesn't overlap the gate line 210b. As shown in FIG. 5B, the source/drain line structure 250b is formed at a side of the gate 210a and two sides of the gate line 210b. Because the source/drain line structure 250b does not make contact with the gate 210a and gate line 210b, a short circuit between the source/drain line structure 250b and the gate 210a/gate line is avoided.

Figure 6A:
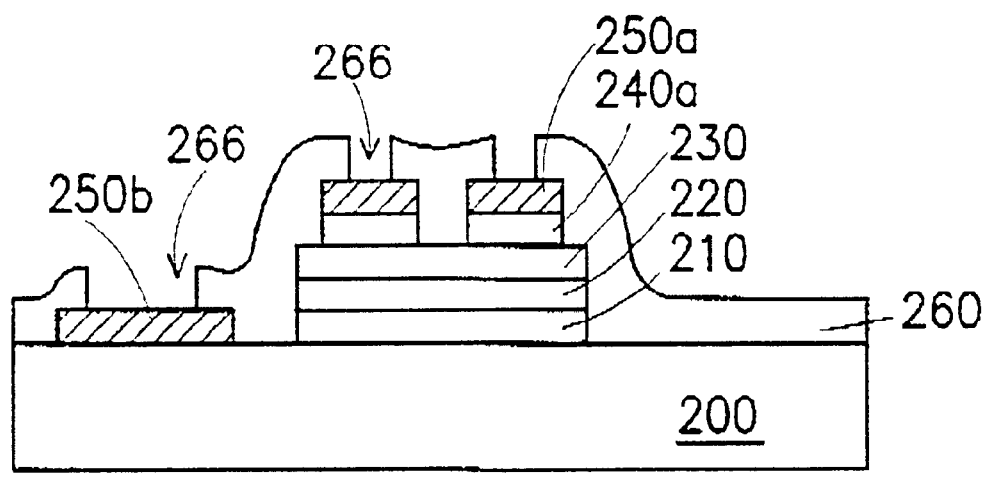
Figure 6B:
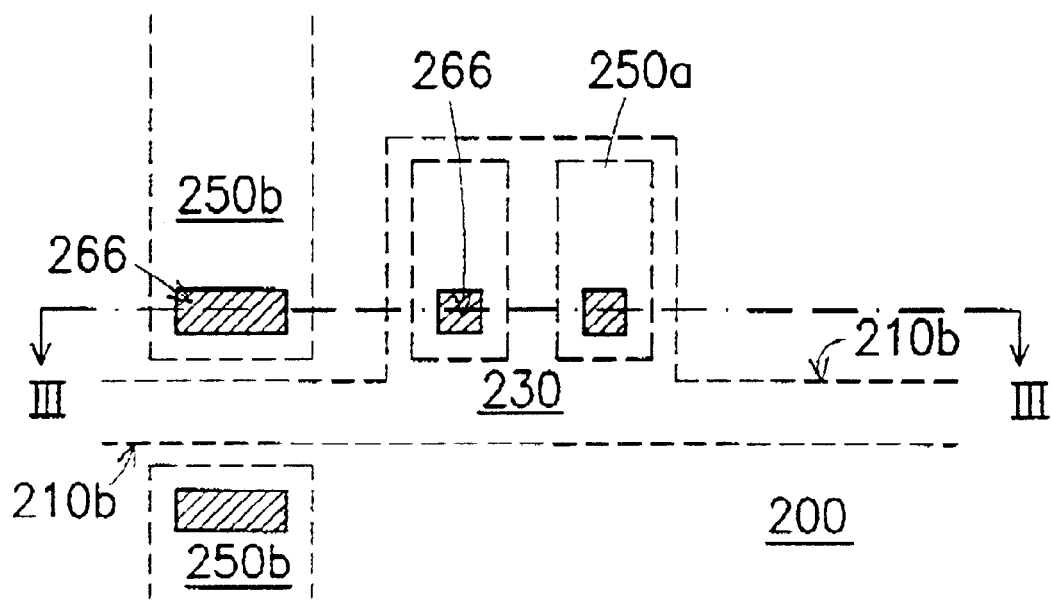

FIG. 6B is a top view of FIG. 6A. In FIGS. 6A and 6B, a protection layer 260, for example a silicon nitride layer, is formed over the insulation substrate 200. The material of the protection layer 260 comprises, for example, silicon nitride. A third step of photolithography and etching is performed on the protection layer 260 to form openings 266 to expose the source/drain line structure 250b and the source/drain conductive layer 250a.

In FIG. 6A and FIG. 6B, a transparent conductive layer 270 is formed on the protection layer 260 and on the surfaces of the openings 266. The material of the transparent conductive layer 270 comprises, for example, indium tin oxide. A fourth step of photolithography and etching is performed on the transparent conductive layer 270, so that a pixel electrode 270a in contact with one of the source/drain conductive layers 250a is formed. At the same time, a portion of the patterned transparent conductive layer 270 is in contact with both the other source/drain conductive layer 250a and the conductive line structure 250b. The electrical connection between the source/drain line structure 250b and one of the source/drain regions 240a is thus constructed. A source/drain line 280 comprising the source/drain line structure 250b and the transparent conductive layer 270 is formed.

Using the above method, a thin-film transistor is formed. The thin-film transistor comprises the insulation substrate 200, the gate 210a, the gate line 210b, the gate dielectric layer 220, the silicon layer 230, the source/drains 240a, the source/drain conductive layers 250a, the source/drain line 280, the protection layer 260 and the pixel electrode 270a. The source/drain line 280 comprises the source/drain line structure 250b and a portion of the patterned transparent conductive layer 270.

Figure 7A:
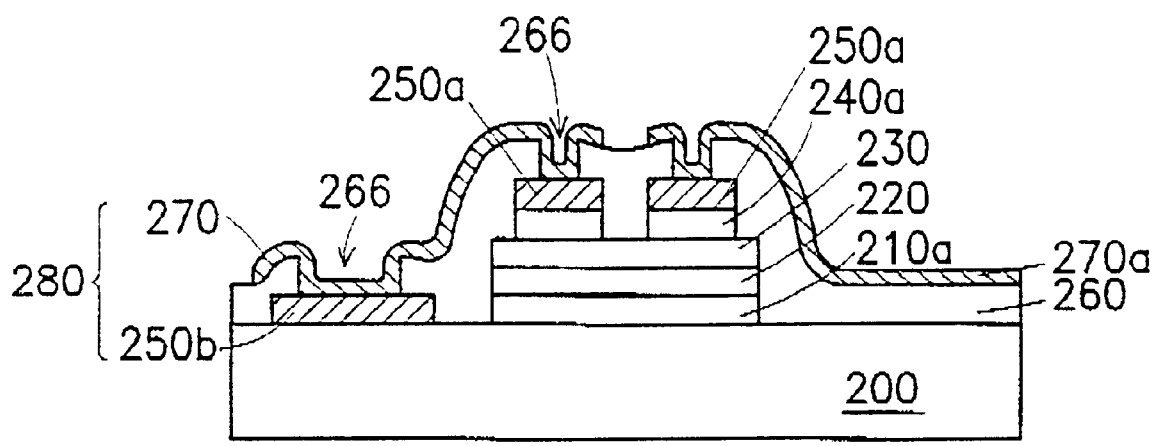
Figure 7B:
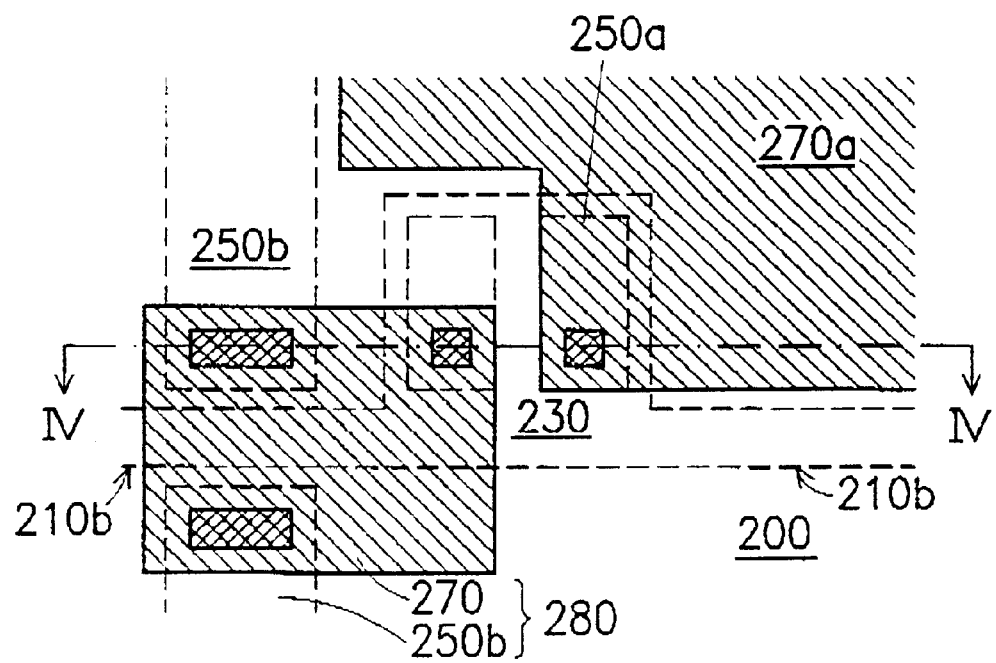

As shown in FIG. 7A and FIG. 7B, the gate 210a and the gate line 210b are located on the insulation substrate 200. The gate dielectric layer 220 is on the gate 210a and the gate line 210b. The silicon layer 230 is on the gate dielectric layer 220. Both the silicon layer 230 and the gate dielectric layer 220 conform to the gate 210a and the gate line 210b. The source/drain regions 240a are located over the gate 210a on the silicon layer 230. The source/drain conductive layers 250a are located on the source/drain regions 240a. The source/drain line structure 250b of the source/drain line 280 is located at two sides of the gate line 210b on the insulation substrate 200. The source/drain line structure 250b is electrically connected to one of the source/drain regions 240a via the patterned transparent conductive layer 270. The protection layer 260 is formed on the silicon layer 230, the source/drain conductive layer 250a and the source/drain line structure 250b with openings 266 to expose the source/drain conductive layer 250a and the source/drain line structure 250b. The pixel electrode 270a is located on the protection layer 260 in contact with a portion of the source/drain conductive layer 250a on one of the drain regions 240a.

In this embodiment, only one photolithography and etching step is required for forming the gate 210a and the gate line 210b (See FIGS. 3A and 3B). The source/drain line structure 250b, the source/drain conductive layer 250a and the source/drain regions 240a also are formed by one photolithography and etching step. Thus, the total number of photolithography and etching steps is reduced from five to four. The fabrication cost is decreased, and the yield of the product is enhanced.

Other embodiments of the invention will appear to those skilled in the art from consideration of the specification and practice of the invention disclosed herein. It is intended that the specification and examples to be considered as exemplary only, with the true scope and spirit of the invention being indicated by the following claims.

What is claimed is:

1. A method of fabricating a thin-film transistor on an insulation substrate, comprising:

forming a first conductive layer, a gate dielectric layer, a silicon layer and a doped silicon layer on the insulation substrate;

performing a first step of photolithography and etching on the doped silicon layer, the silicon layer, the gate dielectric layer and the first conductive layer to form a gate and a gate line;

forming a second conductive layer over the substrate;

performing a second step of photolithography and etching on the second conductive layer and the doped silicon layer to form a source/drain conductive layer, a source/drain line structure at both sides of the gate line, and a source/drain region underlying the source/drain conductive layer;

forming a protection layer over the insulation substrate;

performing a third step of photolithography and etching on the protection layer so that a plurality of openings are formed to expose the source/drain conductive layer and the source/drain line structure;

forming a transparent conductive layer on the protection layer and the openings to couple with the source/drain line structure and the source/drain conductive layer; and performing a fourth step of photolithography and etching on the transparent conductive layer to form a pixel electrode connected with a portion of the source/drain conductive layer, and a portion of the patterned transparent layer electrically connects another portion of the source/drain conductive layer with the source/drain conductive layer.

2. The method according to claim 1, wherein the step of forming the first conductive layer comprises a step of forming a single or a composite layer made of one or multiple layers of various metals and alloys.

3. The method according to claim 2, wherein the metals and alloys are selected from a group consisting of aluminum, copper, gold, silver, molybdenum, chromium, titanium and tungsten.

4. The method according to claim 3, wherein neodymium is also included when aluminum alloy is selected.

5. The method according to claim 1, wherein the step of forming the first conductive layer comprising a step of forming at least a titanium/aluminum/titanium composite layer, including titanium alloy and aluminum alloys.

6. The method according to claim 5, wherein the aluminum alloy comprises neodymium.

7. The method according to claim 1, wherein the step of forming the gate dielectric layer comprises a step of forming a silicon nitride layer.

8. The method according to claim 1, wherein the step of forming the silicon layer comprises a step of forming an amorphous silicon layer.

9. The method according to claim 1, wherein the step of forming the doped silicon layer comprises a step of forming an N-type amorphous silicon layer.

10. The method according to claim 1, wherein the step of forming the second conductive layer comprises a step of forming a single or a composite layer made of one or multiple layers of various metals and alloys.

11. The method according to claim 10, wherein the metals and alloys are selected from a group consisting of aluminum, copper, gold, silver, molybdenum, chromium, titanium and tungsten.

12. The method according to claim 11, wherein neodymium is also included when aluminum alloy is selected.

13. The method according to claim 1, wherein the step of forming the first conductive layer comprising a step of forming at least a titanium/aluminum/titanium composite layer, including titanium alloy and aluminum alloys.

14. The method according to claim 13, wherein the aluminum alloy comprises neodymium.

15. The method according to claim 1, wherein the step of forming the transparent conductive layer comprises a step of forming an indium tin oxide layer.

16. The method according to claim 1, wherein the step of forming the protection layer includes a step of forming a silicon nitride layer.

17. The method according to claim 1 is used for forming a thin-film transistor flat panel display including a liquid crystal display and an organic light-emitting diode.

18. The method according to claim 1 is used for forming a fax machine and a CIS.

* * * * *